(12) United States Patent
Mateski et al.

(10) Patent No.: US 8,290,629 B1
(45) Date of Patent: Oct. 16, 2012

(54) AIRFLOW MANAGEMENT

(75) Inventors: Christopher Joseph Mateski, Overland Park, KS (US); David Wayne Haney, Richmond, KS (US); Andrew Lee Davey, Overland Park, KS (US)

(73) Assignee: Sprint Communications Company L.P., Overland Park, KS (US)

( * ) Notice: Subject to any disclaimer, the term of this patent is extended or adjusted under 35 U.S.C. 154(b) by 1451 days.

(21) Appl. No.: 11/612,114

(22) Filed: Dec. 18, 2006

(51) Int. Cl.
*G05B 13/00* (2006.01)

(52) U.S. Cl. ........ 700/278; 700/276; 700/282; 162/200; 702/45; 137/2

(58) Field of Classification Search .................. 700/276, 700/278, 282
See application file for complete search history.

(56) References Cited

U.S. PATENT DOCUMENTS

| | | | |
|---|---|---|---|
| 6,964,174 B2 * | 11/2005 | Shah | 62/129 |
| 7,017,827 B2 * | 3/2006 | Shah et al. | 236/1 B |
| 2004/0182941 A1 * | 9/2004 | Alles | 236/49.3 |
| 2007/0023533 A1 * | 2/2007 | Liu | 236/1 C |

OTHER PUBLICATIONS

Data Center Management [online] [retrieved on Oct. 18, 2006]. Retrieved from the Internet<http://www.cyclades.com/solutions/technology.php>.
ServerTech EMCU-1 Monitoring Solutions [online] [retrieved on Oct. 18, 2006]. Retrieved from the Internet<http://www.42u.com/servertech-emcu.htm>.

* cited by examiner

*Primary Examiner* — Mohammad Ali
*Assistant Examiner* — Sheela S Rao

(57) ABSTRACT

A method and system are provided for airflow management in a data center. The data center includes network elements, sensors, and heating, cooling and ventilation (HVAC) equipment. The sensors measure climate conditions in the data center and provide an airflow management system with measurements that are utilized to determine which areas in the data center violate data center temperature thresholds and require more air capacity. The airflow management system increases the airflow to areas that contribute to the violation by controlling HVAC equipment to increase air movement or by selecting other areas in the data center or external to the data center that have excess capacity and routing the excess capacity to the areas that contribute to the violation.

20 Claims, 10 Drawing Sheets

AIRFLOW MANAGEMENT

BACKGROUND

Conventionally, data center management systems detect temperature conditions in one or more sections of a data center and generate notifications that are sent to administrators or technicians of the data center management system. The administrator or technician receives the notification and locates the section of the data center to determine whether the temperature condition impacts performance of network elements in the data center. The administrator or technician analyzes the section of the data center and the network elements in the section to suggest one or more solutions that resolve the temperature conditions.

Conventional data center management systems provide views of the temperature conditions in the data center. The views are graphical representations of the temperature conditions in the data center. The administrator or technician may utilize the views to obtain snapshots of the temperature conditions in the data center. Also, the data center management systems define temperature tolerances for each section of the data center. When a temperature tolerance is violated, the data center management system generates the notification to inform the administrator or technician.

The conventional data center management systems merely report the temperature conditions to the administrator or technician. The conventional data center management systems, among other things, do not provide techniques or solutions that intelligently correct the violation of the temperature tolerances without intervention of the administrator or technician. That is, the conventional data center management systems do not provide self-healing techniques or solutions that attempt to resolve the temperature conditions.

SUMMARY

The present invention is defined by the claims below. Embodiments of the present invention solve at least the above problems by providing a system and method for, among other things, managing air flow in a data center. The present invention has several practical applications in the technical arts including controlling heating ventilation and air conditioning (HVAC) equipment based on climate conditions in the data center, routing air to sections in the data center based on a shortest path and a level of excess capacity in other sections of the data center, and maintaining predefined climate conditions, including air flow conditions, in each section of the data center.

In a first aspect, a set of computer-useable instructions provide a method to control airflow in a data center having sensors distributed throughout sections of the data center. The sensors measure climate data, including data center temperature, for each section of the data center and transmits the climate data to an airflow management systems. The airflow management systems compares the measured data center temperature to temperature thresholds. When the airflow management system detects a violation of the temperature thresholds, air flow is routed to sections in the data center that contribute to the violation until the data center temperatures in each of the section that contribute to the violation is within the temperature threshold. Otherwise, the airflow management receives and stores periodic updates to the data center temperature.

In a second aspect, an airflow management system selects an airflow source to route airflow to sections in the data center. The airflow management system receives climate measurements associated with air external to the data center. The airflow management system generates an indication when a violation occurs in the data center. When air external to the data center is acceptable for altering the climate conditions in the data center, the airflow management system generate instructions for routing the air external to the data center to areas in the data center that contribute to the violation. Otherwise, the air contained within the data center is routed to the areas that contributed to the violation.

In a third aspect, an airflow management system includes an airflow database, a server, and a data center having sensors distributed throughout the data center. The data center contains fans, ducts, servos, and HVAC equipment. The sensors capture realtime climate data associated with the data center, and the airflow database stores the realtime climate data and temperature thresholds. The server receives the realtime climate data and utilizes the airflow database and realtime climate data to control air flow in the data center.

BRIEF DESCRIPTION OF THE SEVERAL VIEWS OF THE DRAWINGS

Illustrative embodiments of the present invention are described in detail below with reference to the attached drawing figures, which are incorporated by reference herein and wherein.

DETAILED DESCRIPTION

Embodiments of the present invention provide systems and methods for managing airflow in a data center. The present invention provides a server that receives climate conditions—such as temperature, humidity or power draw—associated with regions in data centers, executes an algorithm using the climate conditions, and controls heating ventilation and air conditioning (HVAC) equipment that routes air flow in the data centers. In an embodiments of the present invention, an airflow management system (AMS) generates instructions that control the HVAC equipment—including vents, servos, fans, heat pumps, humidifiers, and sensors—to maintain an average ambient temperature in the data center or specified sections of the data center.

Acronyms and Shorthand Notations

Throughout the description of the present invention, several acronyms and shorthand notations are used to aid the understanding of certain concepts pertaining to the associated system and services. These acronyms and shorthand notations are solely intended for the purpose of providing an easy methodology of communicating the ideas expressed herein and are in no way meant to limit the scope of the present invention. The following is a list of these acronyms:

| | |
|---|---|
| AMS | Airflow Management System |
| HVAC | Heating Ventilation and Air Conditioning |

As utilized herein, the term "component" refers to any combination of hardware, software, and firmware. Computer-readable media include both volatile and nonvolatile media, removable and nonremovable media, and contemplates media readable by a database, a switch, and various other network devices. Network switches, routers, and related components are conventional in nature, as are means of communicating with the same. By way of example, and not limitation, computer-readable media comprise computer-storage media and communications media.

Embodiment of the present invention provide an airflow management system (AMS) that manages airflow in a data center or any facility hosting heat generating network elements. The AMS may include an airflow database, HVAC equipment, and a server. The airflow database stores the climate data and thresholds for each section of the data center. The server for the AMS executes instructions to receive store climate data, store climate data in the airflow database, and to channel appropriate levels of airflow through the HVAC equipment to appropriate sections of the data center based on data center thresholds stored in the airflow database.

Figure 1:
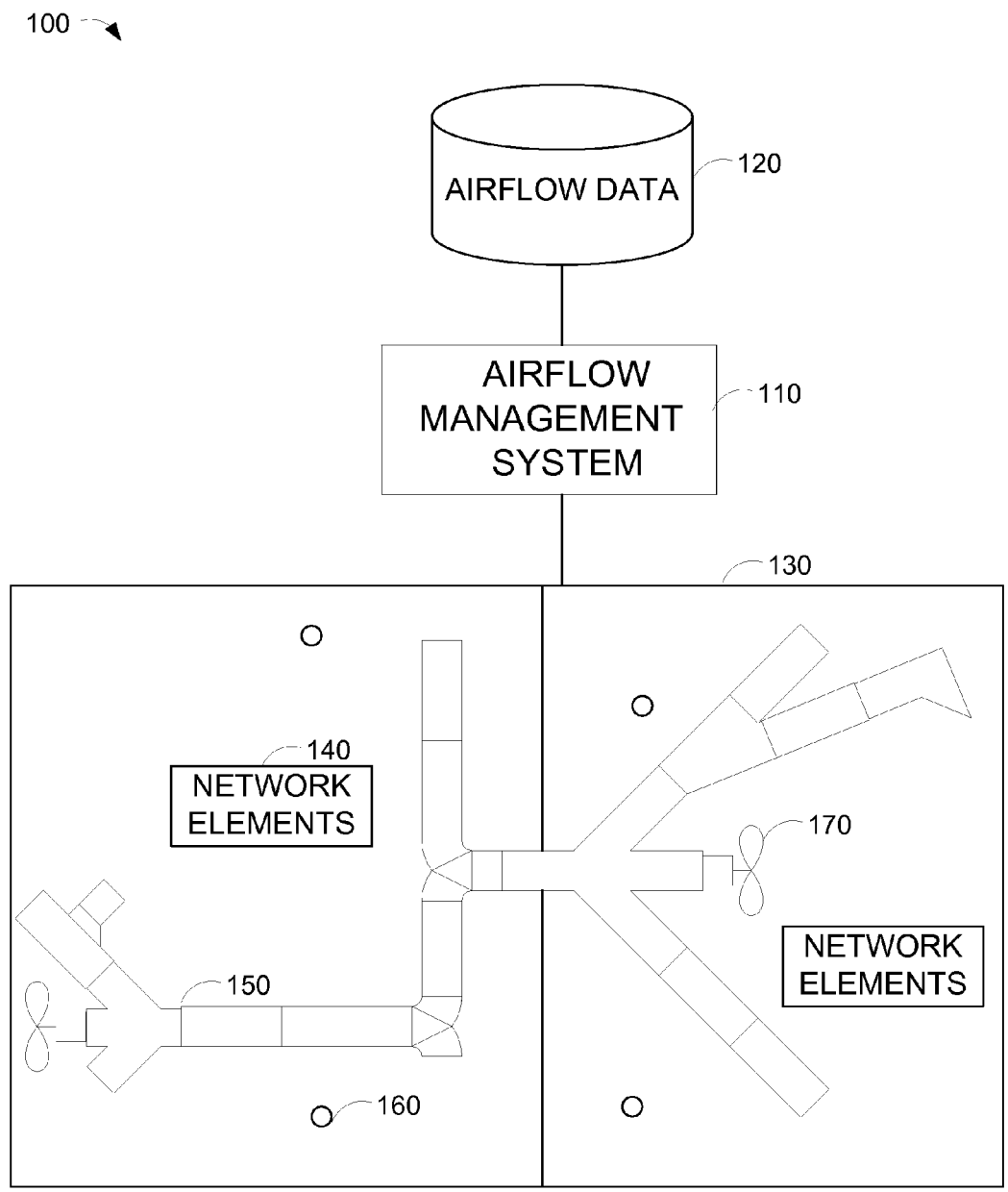
FIG. 1 is a block diagram that illustrates an exemplary airflow management operating environment, according to embodiments of the present invention.

FIG. 1 is a block diagram that illustrates an exemplary airflow management operating environment 100, according to embodiments of the present invention. The airflow management operating environment 100 includes an airflow management system 110, and airflow database 120, and a data center 130.

The airflow management system 110 dynamically varies the airflow in data center based on the climate data received from the data center 130. The airflow management system 110 selects an appropriate air flow sources that effectively alter climate condition in one or more section of the data center 130. The airflow managements system 110 maintains a specified climate condition in the data center 130 and transfers excess air capacity to office space that requires the excess air capacity. In some embodiments, if the airflow management 110 lacks sufficient capacity to maintain the specified climate condition, predefined actions, such as shutting down non-critical systems and reducing data center lighting, are performed by the airflow management system 110.

The data center 130 is a facility that contains network elements 140—such as, servers, hubs, and switches—and power supplies for operating the network elements 140. The data center 130 also include sensors 160, ducts 150, fans 170 and other heating ventilation and air conditioning (HVAC) equipment that regulate the climate in the data center 130.

A larger enterprise network may include multiple data centers 130 that provide services executed by the enterprise network. An average climate temperature, humidity measurement, airflow measurement, or heat index, across the multiple data centers 130 may be utilized as climate thresholds for each data center 130. The climate thresholds may include minimum and maximums climate thresholds.

Each data center 130 in the large enterprise network may be segmented into at least four sections. The sections may have varying sizes and may represent regions in the data center 130 or racks having network elements. Data center 130 hotspots are sections that contain network elements 140, which consume large quantities of electricity and generate high levels of heat. Each section may include routes or ducts 150 that connect to at least one of the other sections. The routes or ducts 150 between sections may be utilized to direct warm or cool air from any combination of section to another section requiring warm or cool air.

For instance, if the data center 130 has four sections: A, B C, and D. Each section may include sensors that measure climate data. Sections A, B, and C may be cool but quadrant D may be above a specified climate threshold and may contain a hotspot. The AMS 110 may trigger the HVAC to route excess cooling from any combination of quadrants A, B, and C. Quadrant D will receive the excess cooling from quadrants A, B, and C until the climate condition falls below the climate threshold. The AMS 110 continuously monitors quadrants A, B, and C to prevent the climate conditions in quadrants A, B, or C from exceeding the climate threshold. If the AMS 110 was taking too much cool air from quadrants A, B, or C and the climate conditions, in each quadrant rise at a high rate, then AMS 110 immediately backs off to reduce the level of cool air routed to quadrant D. Accordingly, the AMS 110 is self-adjusting and dynamically alters the amount of cooling directed to quadrant D, as the climate conditions of quadrant A, B, or C gets closer to the climate thresholds.

The airflow database 120 is utilized by the AMS 110 to store climate data associated with each section in the data center 130 and to determine where and how to route the airflow to the sections in the data center. The climate data may include current temperature, humidity, and power draw for each section in the data center 130. The airflow database 120 may provide a historical record of the climate data fluctuations in each section over a specified period of time. The airflow database 120 may also store information about distances of the HVAC ducts 150 that connect the sections in the data center. The airflow database 120 may also store the number of routes between each section in the data center 130. The airflow database 120 may store route and state information associated with the HVAC equipment 150 and 170 that the AMS 110 utilizes to determine a level of airflow directed to each section in the data center 130. The airflow database 130 may also store capacity of each cooler or heater deployed throughout the data center 130. The AMS 110 utilizes the airflow database 120 to select the appropriate routes and level of airflow to direct to each section of the data center.

Accordingly, the airflow management operating environment dynamically routes airflow to section of the data center based on the climate data measured by the sensors. One of ordinary skill in the art appreciates and realizes that other configurations are within the scope of the present invention.

The airflow database stores climate data associated with each section of the data center. A graphical view may utilizes information from the airflow database to present climate data associated with each section of the data center. FIGS. 2-6 provide graphical views of the data center layout and exemplary routing decisions based on the climate data associated with each section.

Figure 2:
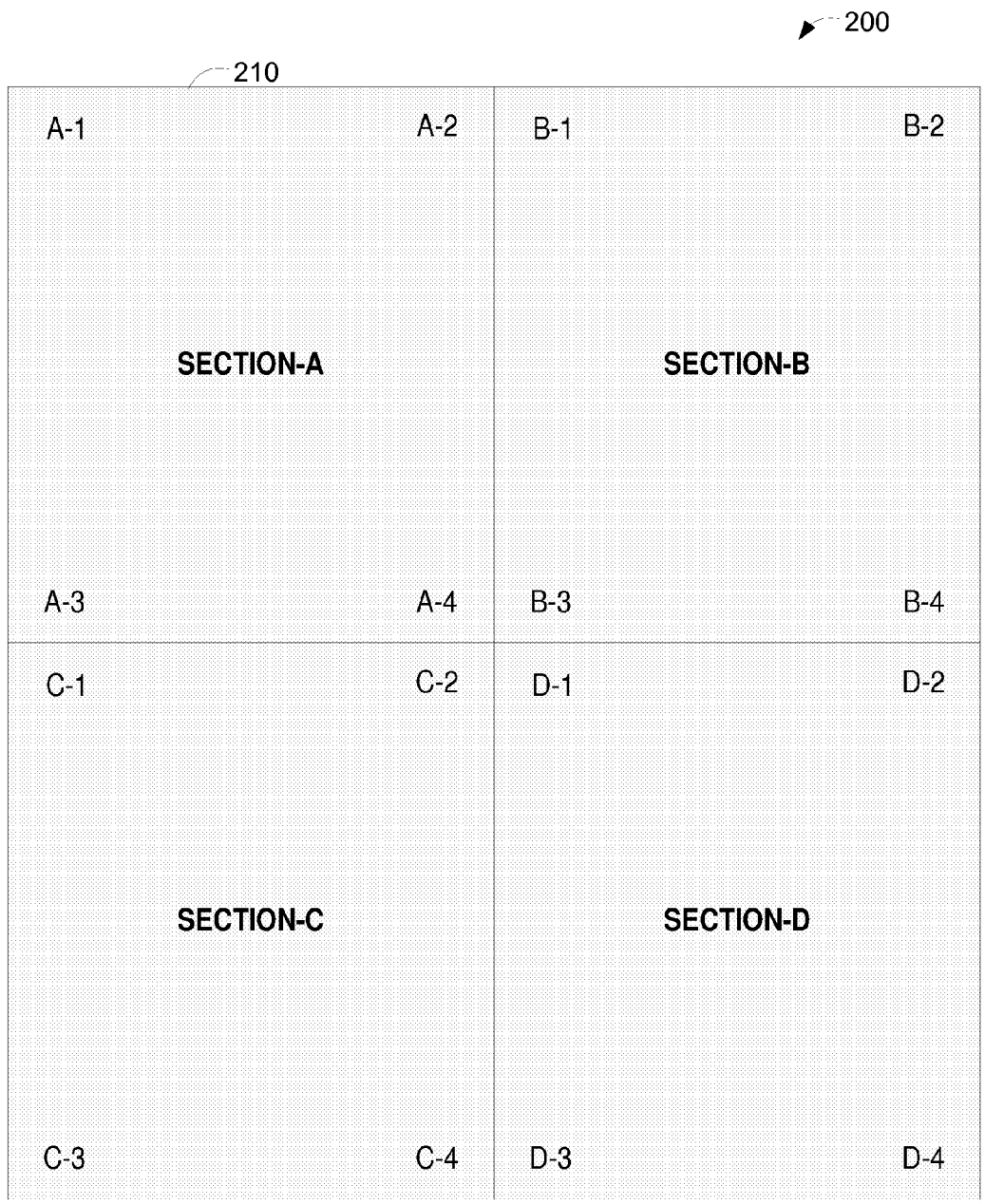
FIG. 2 is block diagram that illustrates an exemplary data center layout, according to embodiments of the present invention.
Figure 3A:
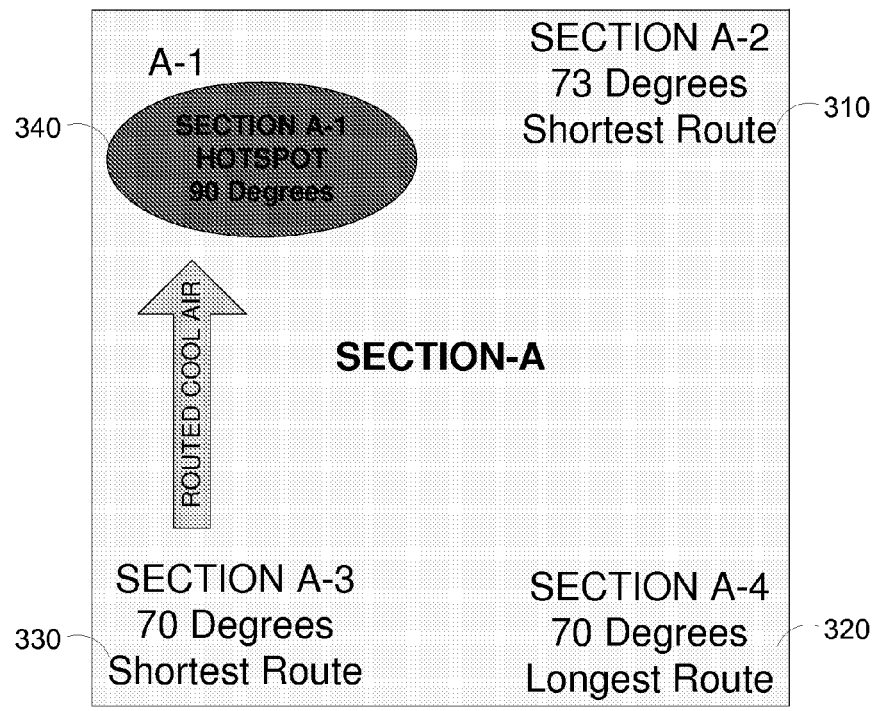
FIG. 3A is a route diagram that illustrates an exemplary routing decision, according to embodiments of the present invention.

FIG. 2 is block diagram that illustrates an exemplary data center layout 200, according to embodiments of the present invention. The data center may include sections 210 that store the network elements. Each section 210 is associated with sensors that provide the airflow database with climate data. Each section 210 of the data center may include subsections contain sensors and network elements. The subsection may provide a granular look at the climate data in each of the sections. FIG. 3A illustrates an AMS that detects a hotspot in a subsection and routes air between subsections of a section in the data center to remove the hotspot.

FIG. 3A is a route diagram that illustrates an exemplary routing decision, according to embodiments of the present invention. A data center having section-A includes subsections 310, 320, 330, and 340. Each of subsections 310, 320, and 330 are operating within the climate thresholds for the data center. Subsection 340 is not operating within the climate thresholds and contains a hotspot. The AMS detects the hotspot in subsection 340 and determines whether subsections 310, 320, or 330 contain sufficient capacity and are capable of providing cool air to subsection 340. After traversing the airflow database, the AMS determines that section 330 is an ideal candidate for providing cool air. The AMS selects the subsection that is the closest to the subsection that needs air. If there is more than one section that meets the distance criteria, the AMS selects one or more subsections that has the lowest temperature. Accordingly, after traversing the airflow database and making the appropriate selections, the AMS generates instructions to trigger the HVAC equipment to transfer cool air from subsection 330 to subsection 340. One of ordinary skill in the art realizes and appreciates that a hotspot may be triggered by a hot or cold temperatures. Thus, the air routed by the AMS may include either cold or hot air based on the air requirements of the section.

Figure 3B:
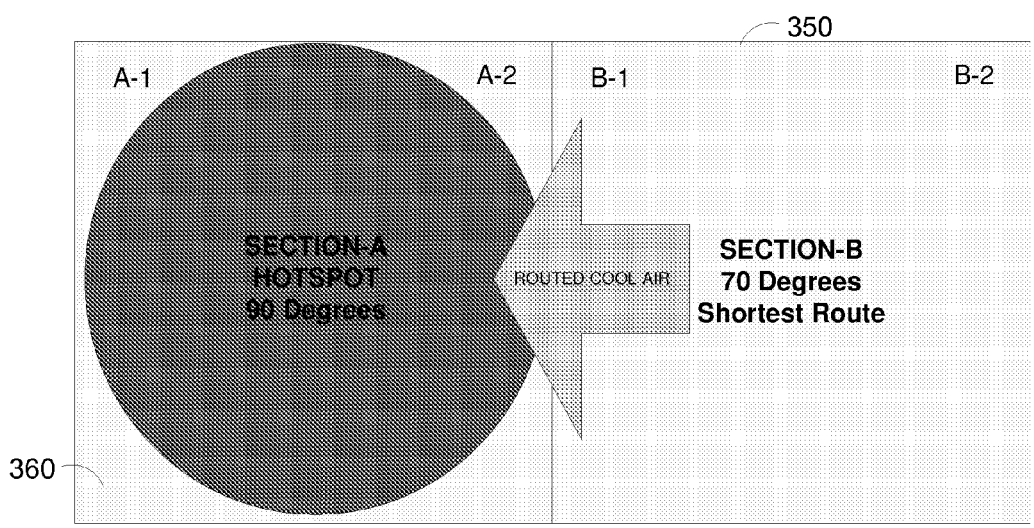
FIG. 3B is a route diagram that illustrates an exemplary routing decision, according to embodiments of the present invention.

FIG. 3B is a route diagram that illustrates an exemplary routing decision, according to embodiments of the present invention. In addition to routing between subsections, the AMS may route air between sections of the data center. In a data center having section 350 and section 360, the AMS may detect a hotspot in section 360. The AMS utilizes the airflow database and decides to route air from section 350 because it is the closest to section 360 and the temperature in section 350 is within the climate thresholds.

The AMS may make routing decisions based on distance and climate measurements associated with each section or subsection. In some embodiments, the AMS may also utilize an airflow capacity associated with each section or subsection to make a routing decision when one or more hotspots are detected.

Figure 4:
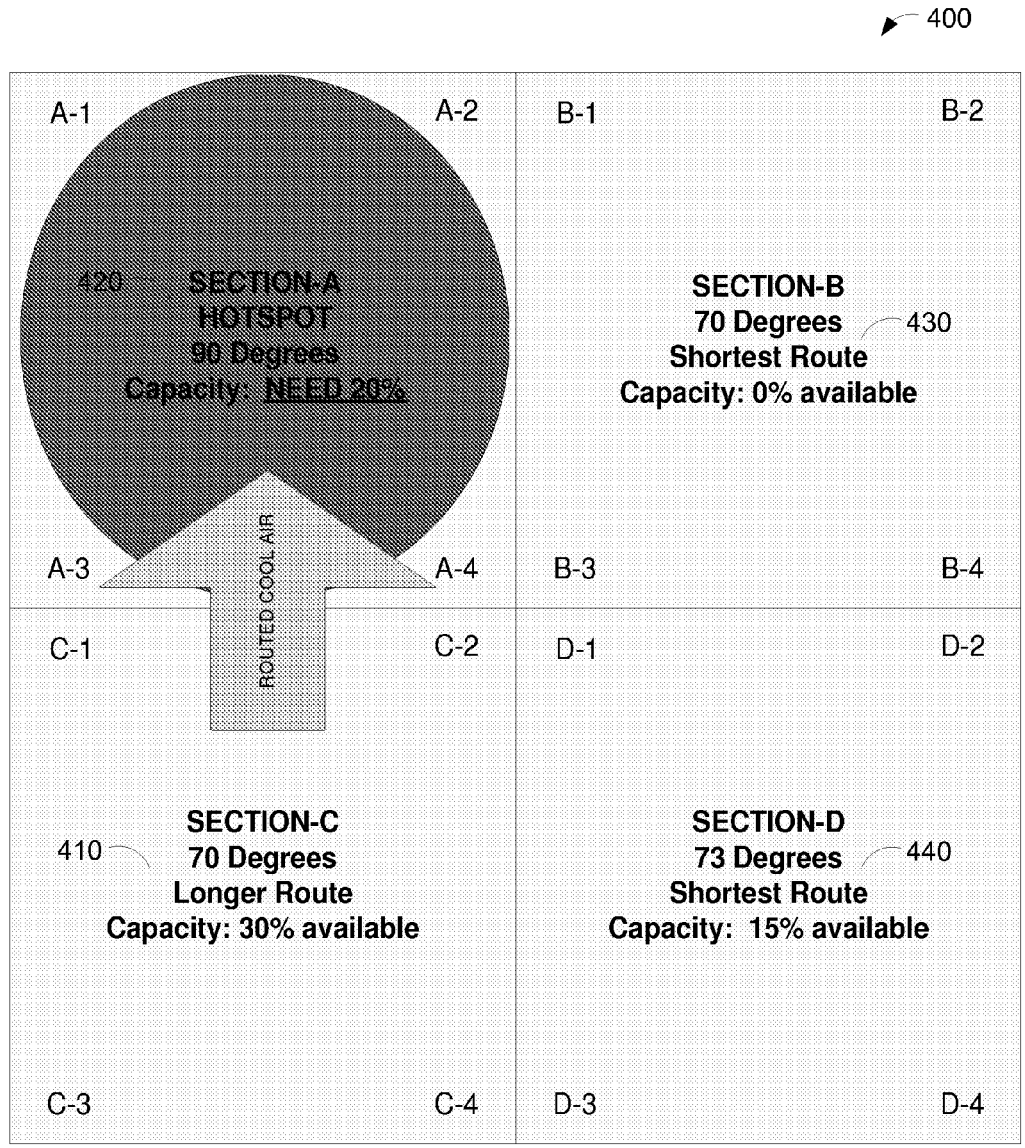
FIG. 4 is a route diagram that illustrates an exemplary routing decision, according to embodiments of the present invention.

FIG. 4 is a route diagram that illustrates an exemplary routing decision, according to embodiments of the present invention. Data center 400 include sections 410, 420, 430, and 440. Each of the sections 410, 420, 430 and 440 is associated with airflow capacity information that represents an excess capacity associated with each of the sections 410, 420, 430 and 440. The AMS detects a hotspot in section 420 and calculates an airflow capacity needed to alleviate the hotspot. The AMS traverse the airflow database to select one or more sections to select the closest route that can satisfy the required capacity. If one section contains sufficient airflow capacity, air is routed from the section with sufficient airflow capacity. If a single section does not contain sufficient airflow capacity, each section that is close to section that requires airflow capacity is accessed and aggregated until the required airflow capacity is achieved. After traversing the airflow database, the AMS selects section 410. While section 440 is the closest section, it lacks the sufficient airflow capacity. Therefore, the AMS selects section 410 because section 410 contains sufficient airflow capacity to meet the need of section 420. The AMS generates appropriate instructions that trigger the HVAC to route air from section 410 to section 420.

In addition to routing based on airflow capacity, distance, and climate measurements associated with each section or subsection, the AMS may route air to section or subsection based on a priority. In some embodiments, a priority associate with each section indicates a relative importance of the network elements in each section of the data center. A priority associated with each section or subsection may range from 1 to 5, where a priority of "1" indicates high importance and a priority of 5 indicates low importance.

Figure 5:
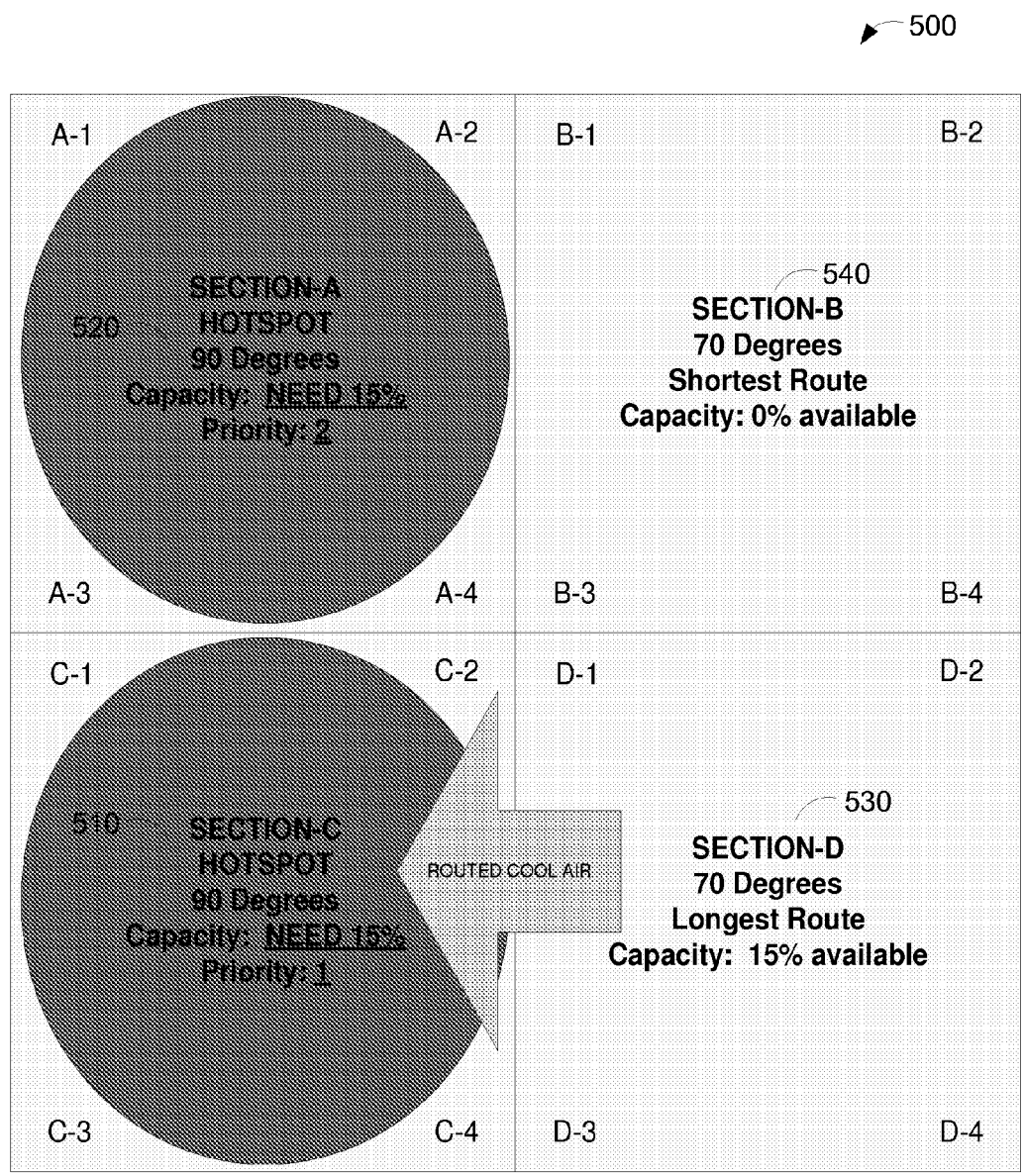
FIG. 5 is a route diagram that illustrates an exemplary routing decision, according to embodiments of the present invention.

FIG. 5 is a route diagram that illustrates an exemplary routing decision, according to embodiments of the present invention. A data center 500 may include sections 510, 520, 530, and 540. Each of section 510, 520, 530, and 540 may include a airflow capacity and a priority level. When the AMS detects a hotspot in sections 510 and 520 an airflow capacity required is calculated for sections 510 and 520. After traversing the database select the section with the required capacity, the AMS selects any hotspot with the highest priority. Section 510 has the highest priority and section 530 has the required capacity that will resolve the hotspot. The AMS generates instructions that trigger the HVAC equipment to route air from section 530 to section 510.

After the data centers climate is maintained and the AMS does not detect new hotspots, climate sensors in office space close to the data center may require air from the data center is excess air capacity is available.

Figure 6:
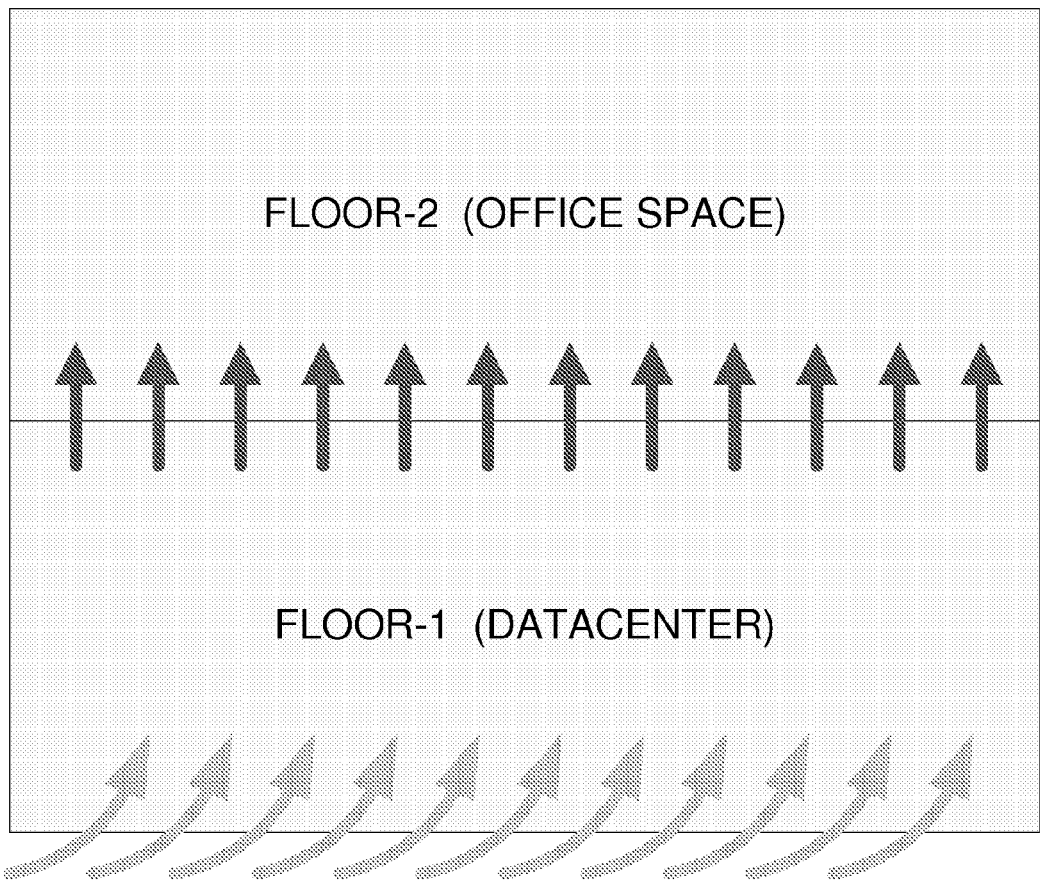
FIG. 6 is a block diagram that illustrates an exemplary airflow transfer between a data center and office space, according to embodiments of the present invention.

FIG. 6 is a block diagram that illustrates an exemplary airflow transfer between a data center and office space, according to embodiments of the present invention. The data center 600 may reach a state where all sections of the data center are operating within the climate thresholds. The AMS may traverse the airflow database and detect that the HVAC equipment can provide excess air capacity to office space that requires airflow. When the climate sensors in the office space detect a hotspot or require air from the data center, the AMS may trigger the HVAC equipment to transfer excess air flow capacity to the office space.

The AMS utilizes the airflow database and measured climate data to control airflow, to select appropriate air sources, to route airflow based on priority information, and to transfer air between the data center and office space. FIGS. 7-10 illustrate, some of the methods performed by the AMS.

Figure 7:
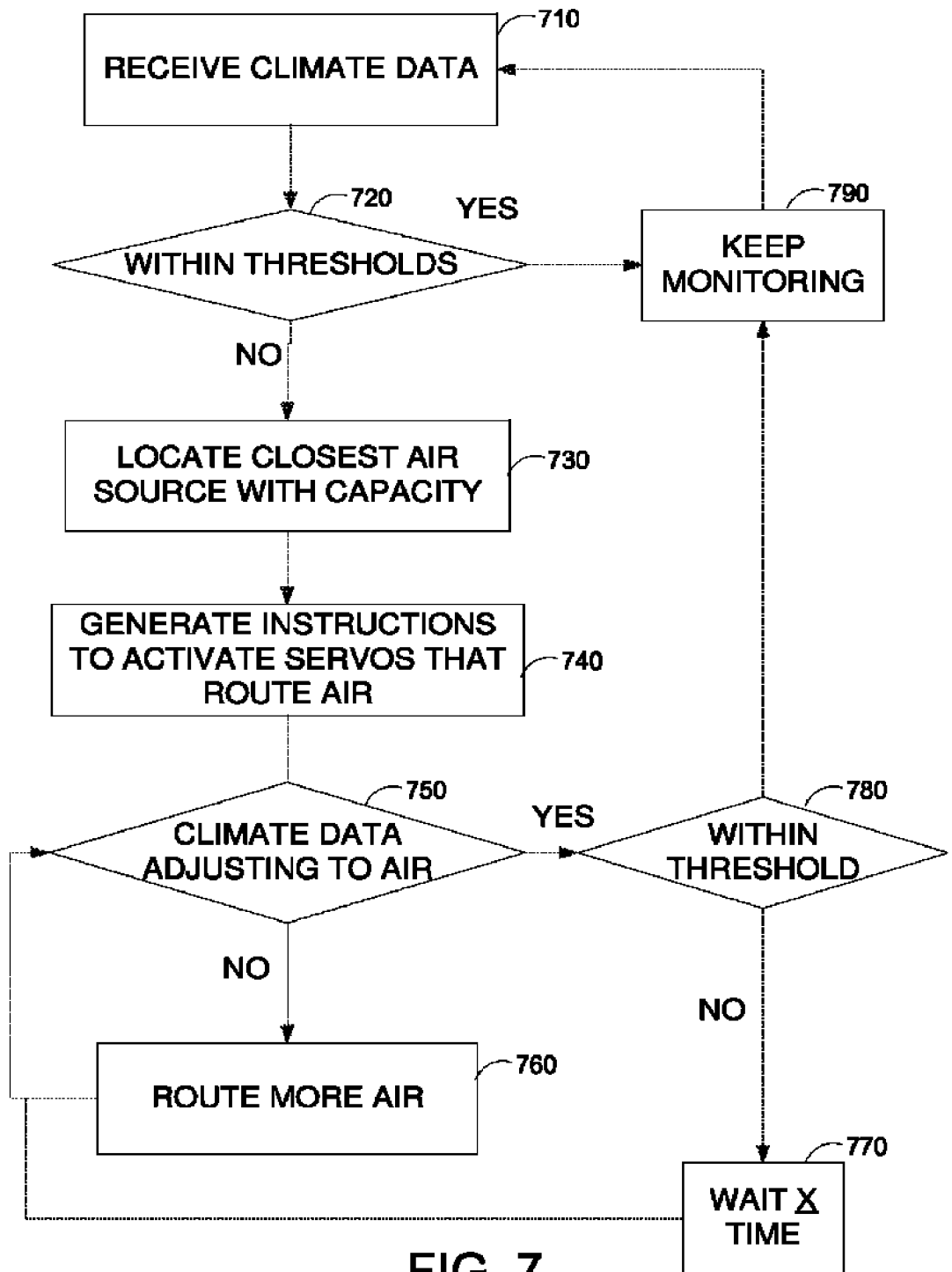
FIG. 7 is a flow diagram that illustrates an exemplary method to control airflow, according to embodiments of the present invention.

FIG. 7 is a flow diagram that illustrates an exemplary method to control airflow, according to embodiments of the present invention. In step 710 the AMS receives climate data from the sensors. The airflow database is checked to determine whether climate data is within the climate thresholds for the data center, in step 720. When the climate data is not within the climate thresholds, the airflow database is search to locate a close air source having excess capacity, in step 730. After selecting the air source, the AMS generates instructions to trigger the HVAC to routes the air to the section or subsection that is not operating within the climate thresholds, in step 740. The climate data is checked to determine whether the hotspot is adjusting the air being routed to the hotspot, in step 750. If the climate data is not adjusting more air is routed by increasing the fan speed or obtaining additional sources. In step 780, a check is made to determine whether the climate data has adjusted to be within the climate thresholds. If the appropriate level of adjustment the has not taken place, the AMS waits for a specified period of time in step 770 and rechecks for an adjustment. If the climate data is within the climate threshold, the AMS continues to monitor the data center, in step 790.

Figure 8:
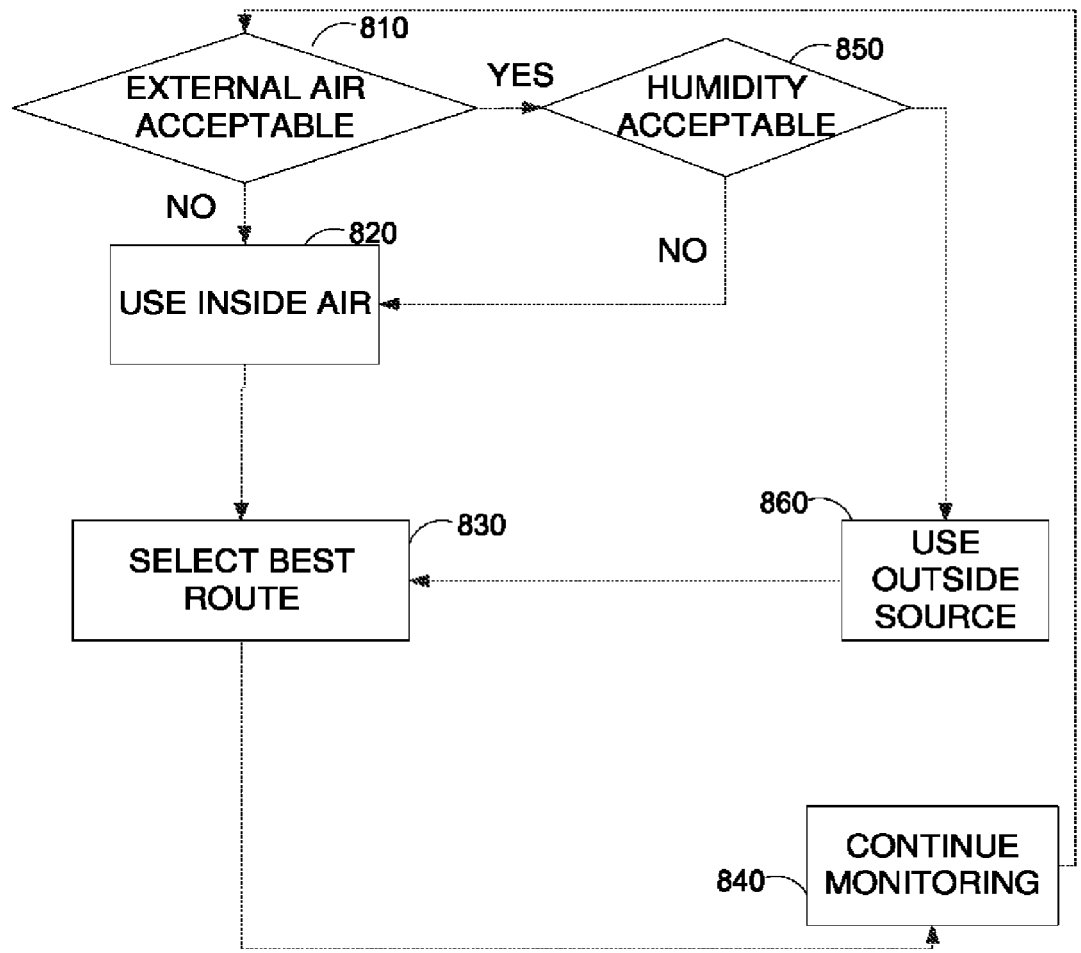
FIG. 8 is a flow diagram that illustrates an exemplary method to select an air source, according to embodiments of the present invention.

The AMS may select air source from air external to the data center or air that is within the data center. FIG. 8 is a flow diagram that illustrates an exemplary method to select an air source, according to embodiments of the present invention. In step 810, it is determine whether air external to the data center is acceptable from resolving a hotspot. If the air is not acceptable, the air inside the data center is utilized to resolve a hotspot, in step 820. In step 830, an appropriate section is selected and the AMS generates the instructions to trigger the HVAC to route the inside air to the hotspot from the selected section.

If the external air is acceptable to resolve the hotspot, the humidity of the external air is checked in step 850. If the humidity is not acceptable, the internal air is used; otherwise, the external is used to resolved the hotspot, in step 860. In turn, the AMS selects an appropriate path to route the external air to the hotspot, in step 830. After resolving the hotspot, the AMS continues monitoring the data center, in step 840.

Figure 9:
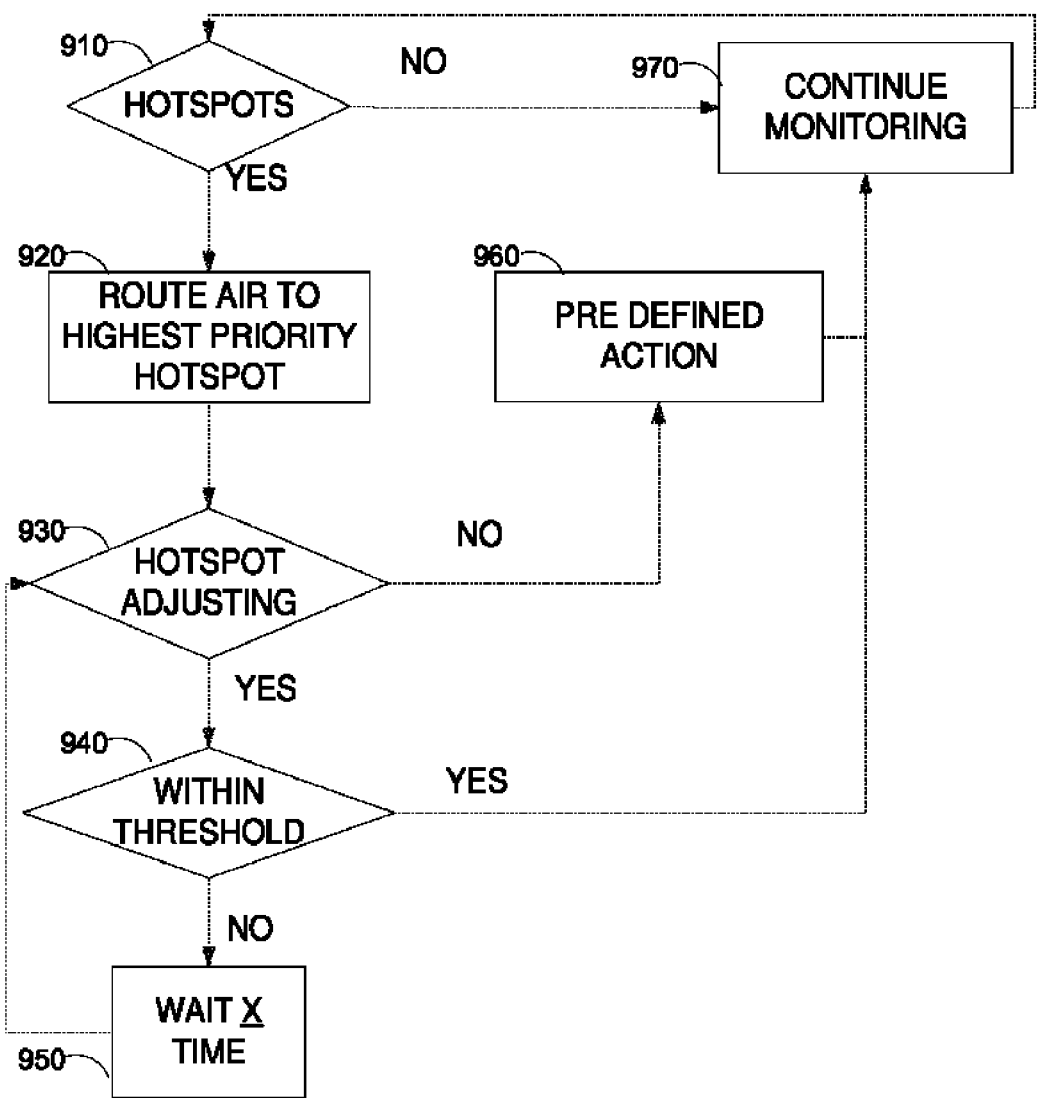
FIG. 9 is a flow diagram that illustrates an exemplary method to route airflow based on priority, according to embodiments of the present invention.

When the data center has multiple hot spots, the AMS resolves the hotspot based on priority. FIG. 9 is a flow diagram that illustrates an exemplary method to route airflow based on priority, according to embodiments of the present invention. In step 910, the AMS detects multiple hotspots. In step 920, the hotspot with the highest priority is selected and the AMS triggers the HVAC to route air to selected hotspot. In step 930, If the climate data associated with the selected hotspot is adjusting, the AMS determines if the climate data is with the climate thresholds for the data center, in step 940, If the climate data is not within the climate thresholds, the AMS waits for a specified period of and rechecks the hotspot to determine if an adjustment occurred. If no adjustment occurs, a predefined action, such as generating a notification, powering off lights, powering off non-critical network elements, or increasing airflow to hotspot is triggered by the AMS, in step 960. Otherwise if the climate data for the hotspot falls within the climate threshold, the AMS continues to monitor the data center and selects that next priority hotspot that need to be resolved.

Figure 10:
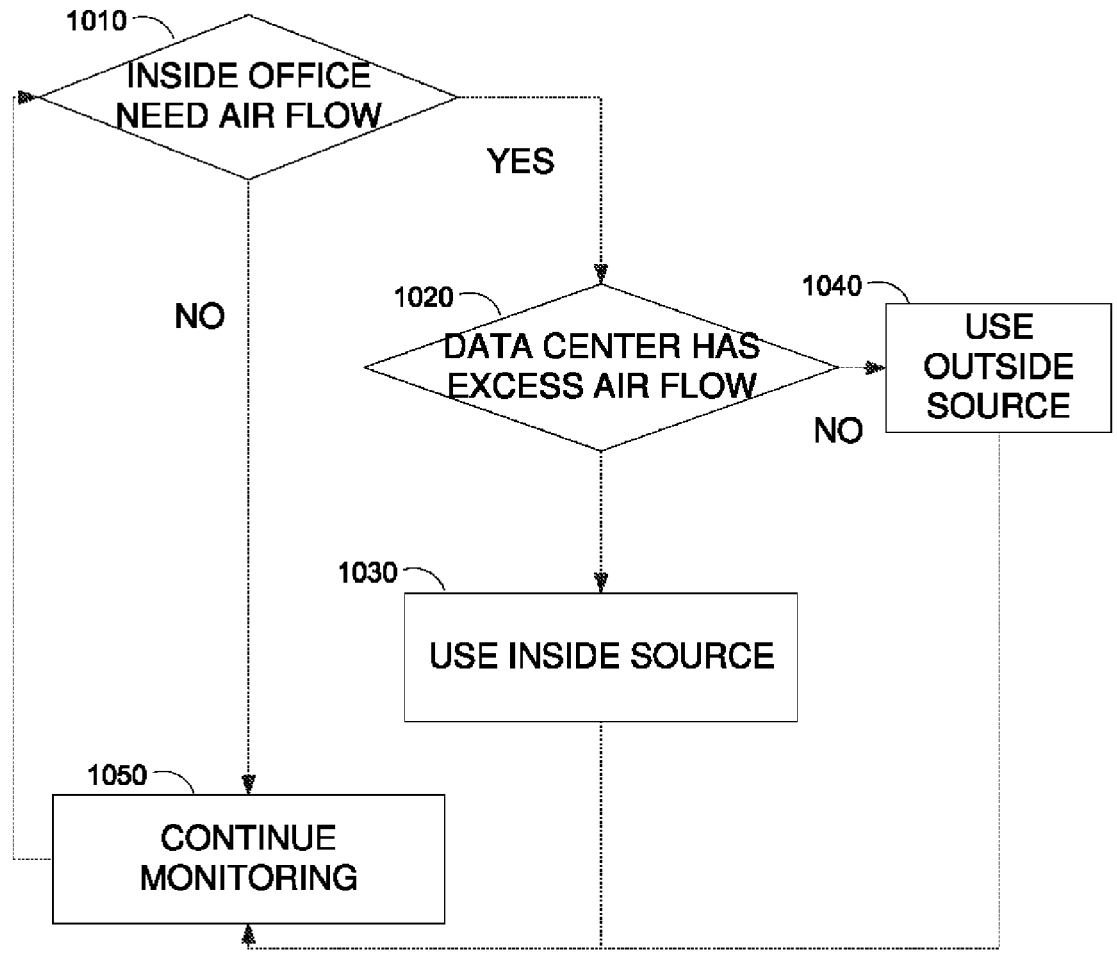
FIG. 10 is a flow diagram that illustrates an exemplary method to transfer airflow to office space, according to embodiments of the present invention.

When all hotspots in the data center are resolved and the AMS detects that the data center has excess capacity, the AMS may trigger the HVAC to route the excess air flow to inside office space that requires airflow. FIG. 10 is a flow diagram that illustrates an exemplary method to transfer airflow to office space, according to embodiments of the present invention. In step 1010, the AMS determines whether the inside offices close to the data center need airflow. If the inside offices need airflow, the AMS checks to determine whether the data center has excess airflow capacity, in step 1020. If the data center has excess capacity, the AMS routes air from the data center to the inside offices, in step 1030. If the data center does not have excess capacity, the AMS utilizes the an external air source to provide air to the inside offices, in step 1040. The AMS continues monitoring the data center and inside office, in step 1050.

Many different arrangements of the various components depicted, as well as components not shown, are possible without departing from the spirit and scope of the present invention. Embodiments of the present invention have been described with the intent to be illustrative rather than restrictive. Alternative embodiments will become apparent to those skilled in the art that do not depart from its scope. A skilled artisan may develop alternative means of implementing the aforementioned improvements without departing from the scope of the present invention.

It will be understood that certain features and subcombinations are of utility and may be employed without reference to other features and subcombinations and are contemplated within the scope of the claims. Not all steps listed in the various figures need be carried out in the specific order described.

The invention claimed is:

1. One or more computer storage media having computer-useable instructions embodied thereon for performing a method to control airflow, the method comprising:
   receiving climate data including data center temperature from one or more sensors located in a data center having multiple sections, each section having at least one airflow generator, and each airflow generator having an airflow capacity;
   comparing temperature thresholds and data center temperature for one or more of the multiple sections to determine if a violation has occurred;
   (1) if a violation has occurred in a first section:
     (a) evaluating climate data for one or more other sections that do not include the first section,
     (b) based on the evaluated climate data, identifying additional airflow capacity available in the one or more other sections that can provide air flow suitable to correct the violation, the suitable air flow produced by one or more airflow generators in the one or more other sections, and
     (c) routing air flow suitable to correct the violation from at least one of the one or more other sections to one or more areas in the first section of the data center that contribute to the violation until the data center temperature in the first section violating the temperature threshold no longer violates the temperature threshold;
   and
   (2) if no violation occurs, periodically receiving and storing data center temperature updates from the one or more sensors.

2. The media of claim 1, wherein the climate data includes airflow, humidity, and power draw.

3. The media of claim 1, wherein a violation occurs when the data center temperature is below the minimum temperature threshold.

4. The media of claim 1, wherein a violation occurs when the data center temperature is above a maximum temperature threshold.

5. The media of claim 1, wherein routing air flow further comprises boosting fan speed to increase cubic feet of air displaced per minute.

6. The media of claim 1, wherein routing air flow suitable to correct the violation further comprises moving air having an appropriate temperature to the areas in the data center that contribute to the violation.

7. The media of claim 6, wherein air is routed to the areas based on priority data associated with each area in the data center.

8. A method to route airflow that utilizes external climate conditions in a data-center environment, the method comprising:
   receiving climate measurements associated with air external to a data center having multiple sections;
   receiving an indication that a violation occurred in a first section of the data center;

determining whether the air external to the data center is acceptable for correcting the violation by altering the climate conditions internal to the data center in the first section of the data center;
  (1) if the air external to the data center is acceptable, routing the air external to the data center to areas in the first section of the data center that contribute to the violation; and
  (2) if the air external to the data center is unacceptable, routing air contained within the data center from one or more of the multiple sections other than the first section to the areas in the first section of the data center that contribute to the violation.

9. The method of claim 8, where the climate measurements include temperature and humidity measurements.

10. The method of claim 8, further comprising archiving the climate measurements in an airflow database.

11. The method of claim 8, wherein the indication provides locations of one or more areas that contribute to the violation.

12. The method of claim 8, wherein the indication includes an air capacity need for one or more areas that contribute to the violation.

13. The method of claim 8, wherein the temperature and humidity measurements associated with the air external to the data center do not violate climate thresholds for the data center.

14. The method of claim 8, wherein routing the air external to the data center includes controlling HVAC equipment to move air from outside the data center to areas inside the data center that contribute to the violation.

15. An airflow management system for a data center, the airflow management system comprising:
  a data center having fans, duct, servos, and HVAC equipment, the data center also having multiple sections that each have HVAC equipment that generates air flow, each piece of HVAC equipment having an airflow capacity;
  one or more sensors that are distributed throughout the data center to capture realtime climate data, including data center temperature;
  an airflow database that stores temperature thresholds and the realtime climate data for the data center; and
  a server that:
    receives the realtime climate data,
    compares the temperature thresholds and realtime climate data to determine if a temperature threshold has been violated, and
    if a violation has occurred in a first section:
    evaluates realtime climate data for one or more other sections that do not include the first section,
    based on the evaluated realtime climate data, identifies additional air flow capacity available in the one or more other sections that can provide air flow suitable to correct the violation, the suitable air flow produced by HVAC equipment in the one or more other sections, and
    routes air flow suitable to correct the violation from at least one of the one or more other sections to one or more areas in the first section of the data center that contribute to the violation until the data center temperature in the first section violating the temperature threshold no longer violates the temperature threshold.

16. The airflow management system of claim 15, wherein the sensors measure, airflow, humidity, and temperature.

17. The airflow management system of claim 15, wherein the airflow database stores climate thresholds for the data center.

18. The airflow management system of claim 15, wherein the airflow database includes a list of cool areas and corresponding airflow capacity for HVAC equipment serving each cool area in the list of cool areas.

19. The airflow management system of claim 15, wherein routing air flow comprises generating instructions that configure and manage the fans, ducts, servos, and HVAC equipment.

20. The airflow management system of claim 15, wherein excess datacenter air is routed to office space when an appropriate climate is achieved in the data center.

* * * * *